United States Patent [19]

Hang et al.

[11] Patent Number: 4,772,574

[45] Date of Patent: Sep. 20, 1988

[54] CERAMIC FILLED GLASS DIELECTRICS

[75] Inventors: Kenneth W. Hang, West Windsor Township, Mercer County; Ashok N. Prabhu, East Windsor Township, Mercer County, both of N.J.

[73] Assignee: General Electric Company, Schenectady, N.Y.

[21] Appl. No.: 122,557

[22] Filed: Nov. 12, 1987

Related U.S. Application Data

[63] Continuation of Ser. No. 914,315, Oct. 2, 1986, abandoned.

[51] Int. Cl.$^4$ .............................................. C03C 8/04
[52] U.S. Cl. ........................................ 501/21; 501/22; 501/26; 428/210
[58] Field of Search ..................... 501/21, 22, 26, 136, 501/137, 138; 428/209, 210

[56] References Cited

U.S. PATENT DOCUMENTS

| | | | |
|---|---|---|---|
| 3,022,179 | 2/1962 | Morrissey | 106/39 |
| 3,501,322 | 3/1970 | Dumbaugh et al. | 106/48 |
| 4,061,584 | 12/1977 | Girard et al. | 501/32 X |
| 4,335,216 | 6/1982 | Hodgkins | 501/138 |
| 4,369,220 | 1/1983 | Prabhu et al. | 428/209 |
| 4,369,254 | 1/1983 | Prabhu et al. | 501/21 |
| 4,377,642 | 3/1983 | Prabhu et al. | 501/26 X |
| 4,385,127 | 5/1983 | Chyung | 501/5 |
| 4,400,214 | 8/1983 | Ogawa et al. | 106/1.13 |
| 4,506,026 | 3/1985 | Hodgkins | 501/136 |

FOREIGN PATENT DOCUMENTS

| | | |
|---|---|---|
| 0084936 | 8/1983 | European Pat. Off. . |
| 0174544 | 10/1984 | Japan ................................... 501/22 |

Primary Examiner—William R. Dixon, Jr.
Assistant Examiner—James M. Hunter, Jr.
Attorney, Agent, or Firm—James Magee, Jr.; James C. Davis, Jr.

[57] ABSTRACT

An improved dielectric ink for the fabrication of multi-layer, copper-based integrated circuits is disclosed. The subject inks comprise a suitable ceramic filler material, an organic vehicle and a lead-zinc-aluminum-borosilicate glass frit. Dielectric layers formed from the subject inks are characterized by exceptional resistance to the penetration therein by flux materials such as PbO and $Bi_2O_3$ from conventional copper conductors during repeated firings.

10 Claims, No Drawings

CERAMIC FILLED GLASS DIELECTRICS

This application is a continuation of application Ser. No. 914,315, filed Oct. 2, 1986, now abandoned.

This invention relates to thick film dielectric materials and their use in fabricating multilayer electrical circuit structures, particularly copper-based structures.

BACKGROUND OF THE INVENTION

The use of specialized ink formulations to form thick films having various functions on suitable substrates in the construction of multilayer integrated circuits is known in the art. Such technology is of increasing interest in the production of very dense multilayer circuit patterns on various substrates for a wide variety of applications in the electronics industry.

Thick film multilayer structures typically are comprised of at least two patterned layers of a conductor separated by a dielectric layer. The patterned conductor layers are connected by metallic conductor deposited in vias in the dielectric layer. Such structures are formed by multiple deposition and firing of layers of conductor and dielectric inks.

Such multilayer circuit structures utilizing copper as the conductor metal have a number of problems. The most common of these is failure caused by the development of electrical shorts due to penetration of the dielectric layers by flux components of the copper conductor ink, such as copper and bismuth oxides, which takes place during multiple firings necessary to produce a multilayer circuit structure. When a conductive channel formed by the penetration of flux components passes completely through a dielectric layer and makes contact between an overlying and underlying copper conductor, an electrical short is produced.

A second problem common to multilayer circuits is porosity in the fired dielectric layers resulting from the evolution of gases from organic vehicle materials during firing. Contaminant materials e.g. molten eutectic phases from fired copper conductor layers, can readily leach into the resulting passages. For this reason, multiple print and firing procedures are conventionally carried out with dielectric inks to seal connected passages.

It is possible to reduce the porosity of a dielectric material by formulating the ink with a higher quantity of glass frit. Both this solution and the multiple print and fire approach can result in the trapping of gases within the dielectric layer. This will cause both the dielectric layer and overlying conductor layers to blister and peel. Added to these considerations is the fact that a vitreous glass can alter its viscosity in response to reactions with external flux phases, such as lead and bismuth oxides. Therefore, it becomes very difficult to predict whether a given glass/filler mixture will yield an impenetrable dielectric for multilayer applications. Such an improved dielectric is, however, provided in accordance with this invention.

SUMMARY OF THE INVENTION

Improved dielectric inks comprise a novel lead-zinc-aluminum-borosilicate glass, a ceramic filler and a suitable organic vehicle. The inks are useful in the fabrication of multilayer integrated circuit structures, particularly those based on copper.

DETAILED DESCRIPTION OF THE INVENTION

The novel dielectric inks of this invention are useful in the fabrication of multilayer integrated circuit structures. While the inks of this invention can be utilized in the fabrication of multilayer structures incorporating other metallic conductors, such as silver, they are particularly suited for production of such structures based on copper conductors and will be so-described herein.

The subject inks are comprised of, on a weight basis: from about 40 to about 65 percent of a glass frit, from about 15 to about 40 percent of a suitable ceramic filler and from about 10 to about 30 percent of an organic vehicle. More preferred ink compositions contain, on a weight basis: from about 45 to 55 percent of the glass frit, from about 25 to about 35 percent of the filler and from about 20 to about 25 percent of the vehicle.

The glass frit component of the inks of this invention consists of, on a weight basis:

(a) from about 7 to about 12 percent of lead oxide (PbO);
(b) from about 52 to about 53 percent of zinc oxide (ZnO);
(c) from about 2 to about 5 percent of aluminum oxide ($Al_2O_3$);
(d) from about 25 to about 26 percent of boron trioxide ($B_2O_3$);
(e) from about 6 to about 8 percent of silicon dioxide ($SiO_2$);
(f) from 0 to about 2 percent of antimony trioxide ($Sb_2O_3$); and
(g) from 0 to about 1 percent of cerium oxide ($CeO_2$).

Although antimony trioxide and cerium oxide are optional ingredients, they are suitably either both present or absent from the frit. When they are present, antimony trioxide is suitably present in from about 0.1 to about 1.8 percent by weight and cerium oxide in from about 0.1 to about 0.6 percent by weight.

A preferred glass formulation containing antimony trioxide and cerium oxide consists of, on a weight basis, about 9.7 percent of PbO, about 52.5 percent of ZnO, about 3.7 percent of $Al_2O_3$, about 25.4 percent of $B_2O_3$, about 7.3 percent of $SiO_2$, about 1.1 percent of $Sb_2O_3$ and about 0.3 percent of $CeO_2$. A preferred formulation in which the optional oxides are absent consists of, on a weight basis, about 10.9 percent of PbO, about 52.6 percent of ZnO, about 3.7 percent of $Al_2O_3$, about 25.5 percent of $B_2O_3$, and about 7.3 percent of $SiO_2$. The glass frits are conventionally prepared by comminuting the various oxides, thoroughly mixing them in the appropriate proportion and melting the mixed oxides, e.g. in air at 1450°–1600° C. In general, it is preferred to have antimony trioxide and cerium oxide present in the subject glass.

The filler of the subject inks is a ceramic material which is desirable to provide reheat stability to the fused dielectric layer. The presence of the filler is desirable to reduce the porosity of the fired dielectric and blistering of the conductor-dielectric composites. Further, the filler provides a good thermal expansion match between the dielectric and the substrate. Suitable ceramic fillers in accordance with this invention include alumina ($Al_2O_3$), barium dimagnesium disilicate ($BaMg_2Si_2O_7$), dimagnesium borate ($Mg_2B_2O_5$), zirconium silicate ($ZrSiO_4$), dimagnesia silicate ($2MgO\cdot SiO_2$), dimagnesia dialumina pentasilicate ($2MgO\cdot 2Al_2O_3$-

5SiO$_2$) and mixtures thereof. A preferred mixture is alumina and barium dimagnesium disilicate in a weight ratio of from about 1:1 to 1:5.

In preparing the subject inks, the solid components, i.e. the glass frit and the filler are combined and reduced to a particle size of from about 1-5 micrometers. The solid particles combined with the organic vehicle and throughly mixed to make the ink. The organic vehicles are selected to give screen printing characteristics to the inks and to burn off cleanly in nitrogen or air, i.e. without leaving a carbonaceous residue.

The organic vehicles are solutions of resin binders such as, for example, cellulose derivatives, particularly ethyl cellulose, synthetic resins such as polyacrylates or methacrylates, polyesters, polyolefins and the like in a suitable solvent. A preferred binder is poly(isobutylmethacrylate). In general, conventional solvents utilized in inks of the type described herein may be used. Preferred commercially available solvents include, for example, pine oil, terpineol, butyl carbitol acetate, 2,2,4-trimethyl-1,3-pentanediol monoisobutyrate, available from Texas Eastman Company under the trademark Texanol and the like. The vehicles suitably comprise from about 5 to about 25 percent by weight of the resin binder. The vehicles also suitably contain from about 0.5 to about 25, preferably from about 1 to about 3, percent by weight of a suitable surfactant such as oleylamine, available as Armeen O, or a high molecular weight N-alkyl-1,3-diaminopropane dioleate, available as Duomeen TDO, both from AKZO Chemie America.

The above resin binders may be utilized individually or in any combination of two or more. A suitable viscosity modifier can be added to the resin material if desired. Such a modifier can be for example, a castor oil derivative available from NL Industries under the trademark Thixatrol. Regardless of the vehicle utilized, it is important that the homogeneity of the ink be maximized. Therefore, mixing is suitably carried out in a conventional apparatus which mixes in combination with subjecting the dispersion to high shearing action.

The dielectric inks of this invention are applied to substrate structures by conventional means, i.e. screen printing, brushing, spraying and the like, with screen printing being preferred. Generally, as is conventional in the art, several individually dried and fired layers of dielectric are utilized to minimize the potential for pin holes. The coating is dried in air at 100°-125° C. for from 10 to 20 minutes and then fired in nitrogen at 850°-900° C. for from 5 to 15 minutes. The subject inks may optionally be treated prior to firing with an oxidizing or a reducing plasma at a temperature below the thermal decomposition temperature of the organic binder as disclosed by Prabhu et al. in U.S. Pat. No. 4,619,836, issued Oct. 28, 1986, the disclosure of which is incorporated herein by reference. The plasma treatment, which is carried out in a conventional apparatus, removes trace residues of the organic binder.

The dielectric layers obtained from the subject inks are comprised of from about 50 to about 80 percent by weight of the glass frit and from about 20 to about 50 percent by weight of the ceramic filler. They have good mechanical strength and excellent reheat stability. Of critical importance is the fact that, due to the absence of significant large modifier ions, dielectric layers formed from the subject inks are particularly resistant to flux penetration. Large modifier ions, when present, provide sites in the glass structure for similarly sized flux ions such as PbO and Bi$_2$O$_3$ to modify the glass properties. These materials, after repeated firings and in the presence of reducing agents that may be in the environment, may be converted to the free metal, thus providing the conductivity which will cause the circuit to short out. A further deterrent to flux penetration into the dielectric layer of this invention is the refractory nature of the crystalline microstructure thereof which is stable upon reheating to 700° C.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Glasses were prepared by weighing the following component oxides, mixing and melting at about 1500° in air in platinum containers. The melts were quenched with dry, counter-rotating ferrous metal rollers having an 0.01 inch gap.

| Constitutent | Glass Formulation (Percent) | | | | |
| --- | --- | --- | --- | --- | --- |
| | A | B | C | D | E |
| PbO | 10.89 | 8.82 | 9.65 | 7.65 | 11.65 |
| ZnO | 52.59 | 52.45 | 52.51 | 53.00 | 52.01 |
| Al$_2$O$_3$ | 3.73 | 3.72 | 3.72 | 4.23 | 3.22 |
| B$_2$O$_3$ | 25.47 | 25.40 | 25.43 | 25.93 | 24.93 |
| SiO$_2$ | 7.32 | 7.31 | 7.32 | 7.82 | 6.82 |
| Sb$_2$O$_3$ | — | 1.77 | 1.06 | 1.06 | 1.06 |
| CeO$_2$ | — | 0.53 | 0.31 | 0.31 | 0.31 |

Inks were prepared by initially comminuting the glass ribbons formed by quenching the melts in a ball-mill to achieve a mean particle size of about 5 micrometers. The glass formulations were combined with alumina and barium dimagnesium disilicate having an average particle size of about 3 micrometers and an organic vehicle comprised of 20 percent of poly(isobutylmethacrylate) dissolved in Texanol and also containing 1 percent of Duomeen TDO. The proportion of the ink was 46.07 percent of the glass frit, 11.52 percent of alumina, 19.19 percent of barium dimagnesium disilicate and 23.22 percent of the organic vehicle.

The ink ingredients were intially hand-mixed, then mixed on a three roll-mill to obtain a smooth paste available for screen printing. Additional solvent was added as necessary to assure proper rheology. The inks were individually printed onto platinum foil, air-dried at 125° for about 15 minutes, then fired in nitrogen at about 900° for 10 minutes. The dielectric layers were peeled from the foil and the coefficient of expansion of each was determined using a fused silica dilatometer. The dielectric layers demonstrated essentially a linear coefficient of expansion from 100° to 700°, whereas similar layers formed from two commercial dielectric ink preparations demonstrated a significant decline in expansion coefficient beginning at about 600°. The coefficient of expansion of the subject dielectrics was advantageously close to and essentially parallel with that of a conventional alumina circuit board substrate.

A layer of the commercial copper conductor ink 5814, available from Remex, Inc. was deposited and fired over an alumina substrate to a thickness of 12.5 micrometers. A dielectric ink containing glass formulation C above was printed and fired over the copper conductor. A layer of the commercial dielectric ink 1903 from Remex, Inc. was deposited and fired over an alumina board having a similar layer of the copper conductor. The substrates were fired in nitrogen at 900°. Microscopic examination of the substrates indicated marked penetration of contaminant flux ingredients from the copper conductor into the commercial dielectric layers, whereas the degree of such contamination was considered minimum in the subject ink. The substantial reduction in flux penetration of the subject dielectric layer is a significant advantage to devices fabricated therefrom.

EXAMPLE 2

A copper conductor ink was prepared according to Prabhu et al. copending U.S. patent application Ser. No. 914,304 entitled "THICK FILM CONDUCTOR INKS", filed Oct. 2, 1986, the disclosure of which is incorporated herein by reference. The ink was comprised of 77 parts of copper powder having an average particle size of 3 micrometers, 2 parts of bismuth oxide powder and 6 parts of a glass frit consisting of 52.5 percent of ZnO, 25.4 percent of $B_2O_3$, 7.3 percent of $SiO_2$, 9.7 percent of PbO, 3.7 percent of $Al_2O_3$, 1.1 percent of $Sb_2O_3$ and 0.3 percent of $CeO_2$. The solid ingredients were mixed with 15 parts of an organic vehicle consisting of a 6 percent solution of ethyl cellulose in Texanol which additionally contained the wetting agents Hypothiolate 100 and Armeen O in concentrations of 17 percent and 3 percent, respectively, based on the vehicle. The ink was initially hand-mixed and then mixed on a three-roll mill to obtain a paste suitable for screen printing. Additional solvent was added as necessary to assure proper rheology.

The copper ink was printed onto a conventional alumina board substrate to form a series of isolated parallel lines 375 micrometers wide separated by spaces of equal width. The copper ink was dried in air at 125° for 15 minutes and fired in nitrogen at 900° for 10 minutes. The substrate was entirely coated with the dielectric ink of Example 1 containing the glass of formulation C. The dielectric ink was dried and fired as in Example 1. Openings or vias were left in the dielectric layer overlying a portion of the copper conductor.

A copper via-fill ink was prepared as follows: a devitrifying glass frit consisting of: 21.8 percent of zinc oxide; 16.5 percent of magnesium oxide; 7.8 percent of barium oxide; 39.2 percent of silicon dioxide; 10.7 percent of aluminum oxide; 1.0 percent of phosphorus pentoxide; and 3.0 percent of zirconium silicate and a vitreous glass frit consisting of: 51.59 percent of barium oxide; 12.58 percent of calcium oxide; 15.62 percent of boron trioxide; and 20.21 percent of silicon dioxide were separately prepared and reduced to a particle size of about three micrometers. Solid ingredients consisting of 65 percent of copper powder having an average particle size of three micrometers, 14 percent of devitrifying glass frit and 4 percent of the vitreous glass frit were thoroughly mixed by hand.

The solid ingredients were mixed with 17 parts of an organic vehicle consisting of a 20 percent solution of poly(isobutylmethacrylate) in Texanol additionally containing, as wetting agents, 17 percent of Hypothiolate 100 and 3 percent of Armeen O. The ink was initially hand-mixed and then mixed on a three-roll mill to obtain a paste suitable for screen printing. Additional solvent was added as necessary to assure proper rheology. The via-fill ink is described in copending U.S. patent application Ser. No. 914,296 of Prabhu et al. entitled "THICK-FILM COPPER VIA-FILL INKS", filed of even date herewith, Oct. 2, 1986.

The via-fill ink was printed into the spaces in the dielectric ink, dried in air at 125° for 15 minutes, and fired in nitrogen at 900° for 10 minutes. The thickness of the dielectric/copper via-fill was 15 micrometers. The dielectric/copper via-fill depositions were repeated three times to form a final thickness of 45 micrometers. A layer of the above copper conductor ink was deposited and fired over the structure so that a portion was in contact with the copper via-fill. This procedure was repeated three times to obtain a multilayer copper-based device having four buried copper layers. In total, 25 firings were required to complete the multilayer circuit.

The structure was biased through electrical contacts made to the copper layers. No evidence of shorting or loss of contact was observed in any of the copper layers.

We claim:

1. A dielectric ink for multilayer integrated circuit fabrication on alumina substrates consisting essentially of,
   (a) from about 40 to about 65 percent by weight of a glass frit consisting of, on a weight basis: from about 7 to about 12 percent of lead oxide; from about 52 to about 53 percent of zinc oxide; from about 2 to about 5 percent of aluminum oxide; from about 25 to about 26 percent of boron trioxide; from about 6 to about 8 percent of silicon dioxide; from 0 to about 2 percent of antimony trioxide and from 0 to about 1 percent of cerium oxide;
   (b) from about 15 to about 40 percent by weight of a ceramic filler; and
   (c) from about 10 to about 30 percent by weight of an organic vehicle.

2. A dielectric ink in accordance with claim 1, wherein the glass frit contains from about 0.1 to about 1.8 percent by weight antimony trioxide and from about 0.1 to about 0.6 percent by weight cerium oxide.

3. A dielectric ink in accordance with claim 1, wherein the glass frit consists essentially of about 9.7 weight percent lead oxide; about 52.5 weight percent zinc oxide; about 3.7 weight percent aluminum oxide; about 25.4 weight percent boron trioxide; about 7.3 weight percent silicon dioxide; about 1.1 percent antimony trioxide; and about 0.3 weight percent cerium oxide.

4. A dielectric ink in accordance with claim 1, the glass frit consisting essentially of about 10.9 weight percent lead oxide; about 52.6 weight percent zinc oxide; about 3.7 weight percent aluminum oxide; about 25.5 weight percent boron trioxide; and about 7.3 weight percent silicon dioxide.

5. A dielectric ink in accordance with claim 1, wherein the filler is selected from the group consisting of alumina, barium dimagnesium disilicate, dimagnesium borate, zirconium dilicate, dimagnesia silicate, dimagnesia dialumina pentasilicate and mixtures thereof.

6. A dielectric ink in accordance with claim 1, wherein the filler material is alumiina and barium dimagnesium disilicate in a weight ratio of from about 1:1 to about 1:5.

7. A dielectric ink in accordance with claim 1, wherein the organic vehicle is a solution of poly(isobutylmethacrylate).

8. A glass frit consisting essentially of from about 7 to about 10 weight percent lead oxide; from about 52 to about 53 weight percent zinc oxide; from about 2 to about 5 weight percent aluminum oxide; from about 25 to about 26 weight percent boron trioxide; from about 6 to about 8 weight percent silicon dioxide; from 0 to about 2 weight percent antimony trioxide and from 0 to about 1 weight percent cerium oxide.

9. A glass frit in accordance with claim 8, consisting essentially of about 9.7 weight percent lead oxide; about 52.5 weight percent zinc oxide; about 3.7 weight percent aluminum oxide; about 25.4 weight percent boron trioxide; about 7.3 weight percent silicon dioxide; about 1.1 weight percent antimony trioxide; and about 0.3 weight percent cerium oxide.

10. A glass frit in accordance with claim 8, comprising, on a weight basis: about 10.9 percent of lead oxide; about 52.6 percent of zinc oxide; about 3.7 percent of aluminum oxide; about 25.5 percent of boron trioxide; and about 7.3 percent of silicon dioxide.

* * * * *